(12) United States Patent
Takahashi et al.

(10) Patent No.: US 6,925,543 B2
(45) Date of Patent: Aug. 2, 2005

(54) BURST TRANSFER MEMORY

(75) Inventors: Makoto Takahashi, Yokohama (JP); Hiroyuki Koinuma, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 355 days.

(21) Appl. No.: 10/237,028

(22) Filed: Sep. 9, 2002

(65) Prior Publication Data

US 2004/0003195 A1 Jan. 1, 2004

(30) Foreign Application Priority Data

Jun. 27, 2002 (JP) ........................................ 2002-188569

(51) Int. Cl.[7] ............................................. G06F 12/00
(52) U.S. Cl. ........................... 711/170; 711/5; 345/537; 365/230.09
(58) Field of Search ................................ 711/104, 105, 711/170; 345/537, 543; 365/230.09, 221

(56) References Cited

U.S. PATENT DOCUMENTS 5,703,822 A 12/1997 Ikeda ........................ 365/221
5,953,244 A 9/1999 Okada et al. ................. 365/63
6,151,268 A * 11/2000 Yoshikawa ............. 365/230.09

* cited by examiner

*Primary Examiner*—Pierre M. Vital
(74) *Attorney, Agent, or Firm*—Oblon, Spivak, McClelland, Maier & Neustadt, P.C.

(57) ABSTRACT

The present invention provides a burst transfer memory comprising a first memory having a cell array arranged in a matrix, a second memory which has a cell array arranged in a matrix and which performs a random access operation at a higher speed than the first memory, and an interface circuit which controls the first and second memories as one burst transfer memory, and wherein the interface circuit allocates addresses to the first and second memories as consecutive addresses, and the interface circuit substantially simultaneously starts the first random access to the first and second memories, accesses the second memory before a word line of the first memory is activated, and consecutively accesses a page of the first memory after the word line of the first memory has been activated.

16 Claims, 4 Drawing Sheets

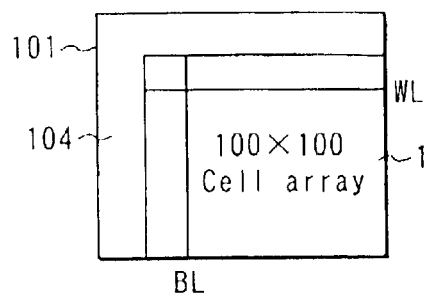
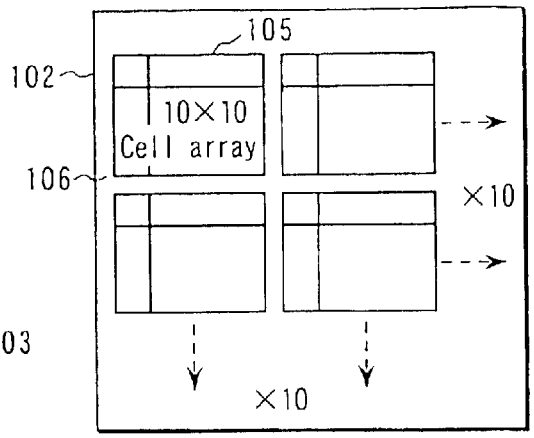
FIG. 1A PRIOR ART  FIG. 1B PRIOR ART
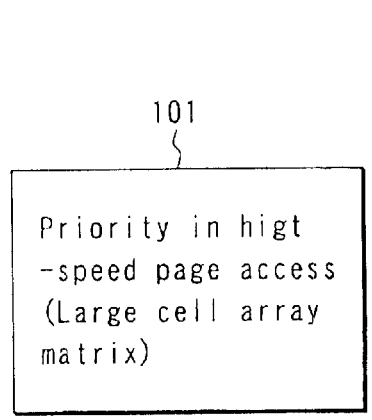
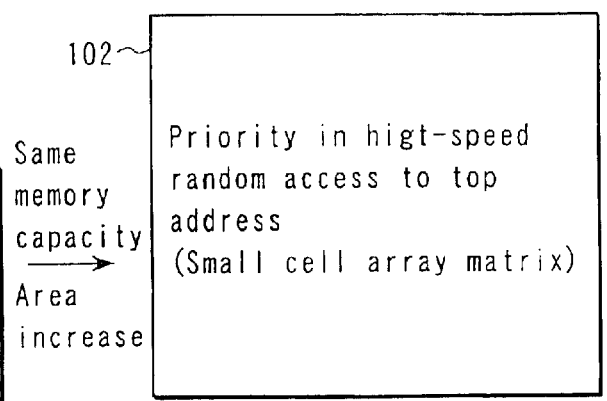
FIG. 2A PRIOR ART  FIG. 2B PRIOR ART
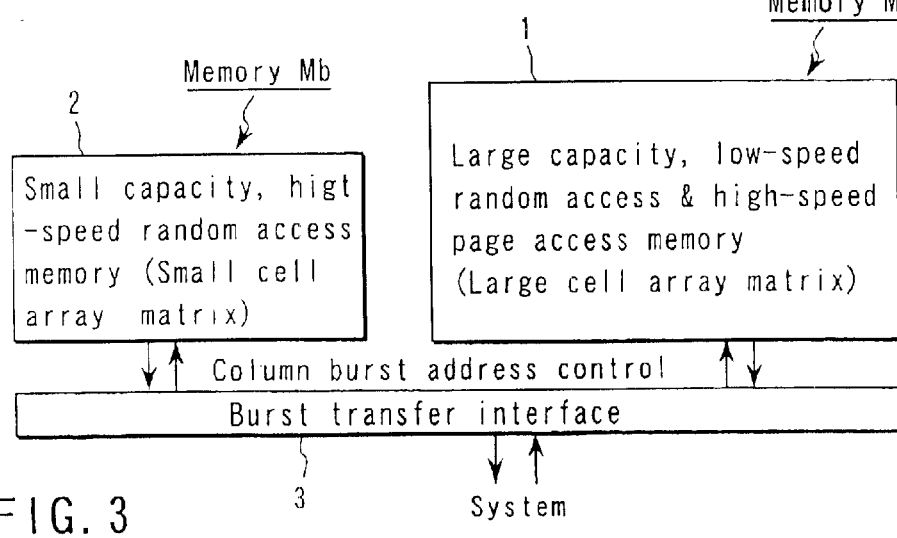
FIG. 3

BURST TRANSFER MEMORY

CROSS-REFERENCE TO RELATED APPLICATIONS

This application is based upon and claims the benefit of priority from the prior Japanese Patent Application No. 2002-188569, filed Jun. 27, 2002, the entire contents of which are incorporated herein by reference.

BACKGROUND OF THE INVENTION

1. Field of the Invention

The present invention relates to a semiconductor memory device, and in particular, to a burst transfer memory.

2. Description of the Related Art

An increase in speed of a semiconductor memory device (hereinafter referred to as a "memory") conventionally tends to result in an increase in chip size of the memory. For example, to implement a memory with a large storage capacity and a small chip size, it is desirable to increase the number of rows and columns in a cell array as much as possible. On the other hand, to implement a high-speed memory, the speed is increased by reducing the number of rows and columns in the cell array according to requirements to reduce loads on bit and word lines. Thus, in this case, the chip size of the entire memory tends to increase.

Now, this problem will be described in further detail with reference to FIGS. 1A, 1B, 2A, and 2B. A memory 101, shown in FIG. 1A, is composed of a cell array 103 consisting of 100 rows and 100 columns, a peripheral circuit 104, word lines WL, and bit lines BL. Further, a memory 102, shown in FIG. 1B, is composed of, for example, 100 cell arrays (hereinafter referred to as "sub-arrays") consisting of ten cell arrays arranged in both row and column directions and each of which consists of 10 rows and 10 columns, a peripheral circuit 106, word lines WL, and bit lines BL.

To increase the speed of the memory 101, shown in FIG. 1A, the cell array 103 may be divided into a large number of sub-arrays 105 as shown in FIG. 1B to reduce loads on the word lines WL. However, if the cell array is divided into a large number of sub-arrays, the sum of occupation areas of the peripheral circuit 106, shown in FIG. 1B, increases drastically compared to the occupation areas of the peripheral circuit 104, shown in FIG. 1A. Accordingly, with the same memory capacity, the chip area of the memory 102 increases sharply above that of the memory 101.

On the other hand, as a memory that operate at a higher speed in spite of its large cell array matrix, a page access memory is known wherein a row address is used to select a word line so that memory data connected to the word line can be accessed by consecutively accessing column addresses and then input or output at a high speed. In this manner, the time required to access memory data can be drastically reduced compared to random access operations. However, with a memory with a large cell array matrix, when a top address of a page is accessed, much time is disadvantageously required to activate the corresponding word line.

Thus, there has hitherto been a tradeoff relationship between the access speed and cell array area of a memory. Consequently, it is difficult to reduce the area of a large-capacity memory while increasing the speed thereof.

That is, for a memory for which priority is given to a larger memory capacity, it is possible to minimize the area of the entire memory by increasing the number of rows and columns in the cell array as shown at 101 in FIG. 1A. However, if an attempt is made to increase the speed by reducing the number of rows and columns in the cell array to reduce loads on the bit and word lines as shown at 102 in FIG. 1B, then the area of the entire memory increases relative to the same memory capacity.

Further, for a page access memory, if priority is given to page accesses faster than the first (top address) random access as shown at 101 in FIG. 2A, then it is possible to increase the size of the cell array matrix, while minimizing the chip area. However, if it is desirable to increase not only the speed of page accesses but also the speed of the first random access as shown at 102 in FIG. 2B, then the chip area disadvantageously increases because the cell array must be divided into smaller cell array matrices in order to increase the speed of random accesses.

As described above, for the conventional large capacity memories, there is a tradeoff relationship between the access speed and cell array area of the memory, thereby making it difficult to reduce the chip area of the large capacity memory, while achieving high-speed operations. The embodiments of the present invention are provided to solve these problems. It is an aspect of the present invention to provide a large capacity memory which has a reduced chip area and which can operate at high speeds.

BRIEF SUMMARY OF THE INVENTION

A burst transfer memory according to an embodiment of the present invention comprises a first memory having a cell array arranged in a matrix, a second memory which has a cell array arranged in a matrix and which performs a random access operation at a higher speed than the first memory, and an interface circuit which controls the first and second memories as one burst transfer memory, wherein the interface circuit allocates addresses to the first and second memories as consecutive addresses, and the interface circuit substantially simultaneously starts the first random access to the first and second memories, accesses the second memory before word lines of the first memory are activated, and consecutively accesses a page of the first memory after the word lines of the first memory have been activated.

BRIEF DESCRIPTION OF THE SEVERAL VIEWS OF THE DRAWING

FIGS. 1A and 1B are diagrams useful in describing examples of the configurations of a conventional large capacity memory and a conventional high-speed memory;

FIGS. 2A and 2B are diagrams useful in describing problems with a conventional large capacity, high-speed memory;

FIG. 3 is a block diagram showing the configuration of a burst transfer memory according to a first embodiment;

DETAILED DESCRIPTION OF THE INVENTION

Figure 4A:
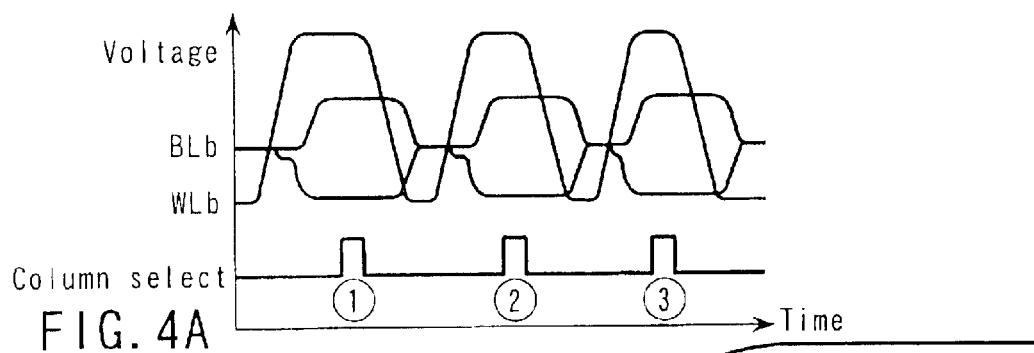
FIGS. 4A to 4D are timing wave form diagrams showing the operation of a burst transfer memory according to a second embodiment.

Next, the configurations and operations of burst transfer memories according to the embodiments of the present invention will be described with reference to the drawings.

<First Embodiment>

The configuration of a burst transfer memory according to a first embodiment will be described with reference to FIG. 3. The burst transfer memory shown in FIG. 3 is composed of a large capacity, low-speed random access memory for high-speed page access operations 1, a small capacity and high-speed memory only for random access use 2, and a burst transfer interface 3 that controls column burst addresses. The large capacity, low-speed random access memory for high-speed page access operations 1 and the small capacity and high-speed memory only for random access use 2 will hereinafter be called the "memory Ma" and "memory Mb", respectively.

With the burst transfer memory of the present invention, the memory Ma is caused to perform high-speed page access operations for writes therein and reads therefrom. As previously described, the memory Ma has a larger cell array matrix. Accordingly, much time is required to activate a word line specified by a top address, but high-speed writes or reads can subsequently be executed using high-speed page access operations. On the other hand, the memory Mb has a smaller cell array matrix. Accordingly, the word line can be quickly activated to perform write and read operations on the memory Mb as a high-speed memory only for random access use.

Thus, a large capacity, high-speed burst transfer memory can be implemented by using the memory Mb for a random access to the top address before a high level is fixed in the word lines of the memory Ma, which has a larger matrix size, and continuing to use the memory Ma for high-speed page access operations after the high level has been fixed in the word lines of the memory Ma, which has a larger matrix size.

In this manner, a large capacity burst transfer memory operating at high speeds can be implemented by using the burst transfer interface 3, which controls column burst addresses, to combine the memories Ma and Mb together to suppress an increase in entire area.

That is, the burst transfer memory is composed of the large capacity, low-speed random access memory Ma, the small capacity, high-speed random access memory Mb, and the burst transfer interface 3, which controls column burst addresses. Further, for a random access to the top address, the small capacity memory Mb is accessed, and at substantially the same time, activation of a row address of the large capacity memory Ma is started. While the random access to the top address is being carried out in the small capacity memory Mb at a high speed, the row address of the large capacity memory Ma is completely activated. Subsequently, a high-speed page access operation of the large capacity memory Ma is started.

The burst transfer interface 3 can manage and control the order in which the addresses of the memories Ma and Mb are allocated (to a continuous address space) and accessed as consecutive addresses. Thus, a high-speed burst transfer memory with a high area efficiency can be constructed by combining the large capacity, high-speed page access memory Ma, which carries out row activation and random access at low speeds and has a large cell array to suppress an increase in area, with the small area and high-speed random access memory Mb, which has a smaller cell array.

In the burst transfer memory shown in FIG. 3, the memories Ma and Mb have an equal width in their word line direction. Accordingly, the memory Mb must be designed so that particularly the word lines can be activated at a higher speed than those of the memory Ma.

In the burst transfer memory shown in FIG. 3, provided that the memory Mb is designed to be accessed at a sufficiently high speed compared to the rise speed for the word lines of the memory Ma, no special attention needs to be paid to the widths of the memories Ma and Mb in their word line direction.

When the large capacity memory Ma is composed of a cell array consisting of A rows and B columns, the small capacity memory Mb may be composed of a cell array consisting of C rows and D columns (A>C, B>D) or A rows and D columns or C rows and B columns. In the following embodiments, the cell arrays of the memories Ma and Mb are configured as described above.

Further, in the burst transfer memory shown in FIG. 3, provided that the small capacity, high-speed random access memory Mb is designed to be accessed at a sufficiently high speed compared to the rise speed for the word lines of the large capacity, high-speed memory Ma, the memory Ma may be of a type different from that of the memory Mb. Furthermore, the arrangement of the memories Ma and Mb and burst transfer interface, shown in FIG. 3, may be varied. In addition, the speed of random access operation of the memory Mb may be increased by dividing the cell array of the memory Mb into sub-arrays to substantially reduce the length of the word lines of the memory Mb.

<Second Embodiment>

Now, a second embodiment will be described with reference to FIGS. 4A to 4D. In the second embodiment, the operation of the burst transfer memory of the present invention will be described in detail with reference to a timing wave form diagram.

FIG. 4A is a timing wave form diagram showing a read operation of the small capacity random access memory Mb (see FIG. 1). In FIG. 4A, reference characters WLb and BLb denote the waveforms of the voltages across a word line and a pair of bit lines observed during a read operation of the memory Mb. During each read cycle, when the word line WLb selected using a row address is set to a high level, a memory cell transistor becomes conductive to load charges from a cell capacitor onto the equalized bit lines BLb. The charges are then latched by a sense amplifier connected to each column to set the voltages across the bit line and complementary bit line to the high level and a low level, respectively.

During the first read cycle, in response to a column select signal ①, memory data loaded into each column as the high and low levels are transferred to an input and output section (hereinafter referred to as an "I/O" section) via write and read data lines (hereinafter referred to as "DQ lines"). Once the first read cycle is completed, the word line WLb returns to the low level. The bit line and complementary bit line are equalized. Then, the process shifts to the second read cycle. In response to a column select signal ②, memory data are transferred to the I/O section via the DQ lines.

In this manner, the memory data randomly read from the cell array of the memory Mb on the basis of the row and column addresses are transferred to the I/O section via the DQ line.

Figure 4B:
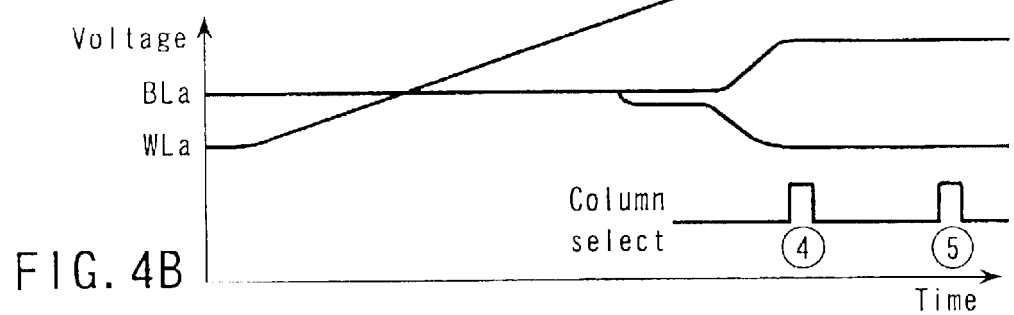

FIG. 4B is a timing wave form diagram showing a read operation of the large capacity, high-speed page access memory Mb. In FIG. 4B, reference characters WLa and BLa denote the waveforms of the voltages across a word line and a pair of bit lines observed during a read operation of the memory Ma. When the word line WLa is set to the high level, a memory cell transistor becomes conductive to load charges from a cell capacitor onto the equalized bit lines BLa. This readout voltage is then latched by a sense amplifier to set the voltages across the bit line and complementary bit line to the high and low levels, respectively.

In a read operation of the large capacity, high-speed page access memory Ma, the rise time for the word line WLa is normally longer than that for the word line WLb of the small capacity random access memory Mb. Once the word line WLa of the memory Ma has reached the high level, the sense amplifier arranged at each column is activated to set the bit and complementary bit lines to the high or low level according to the memory data. In this manner, after the data from all memory cells connected to the selected word line WLa have been loaded onto each column, the data from these memory cells are burst-transferred to the I/O section via the DQ lines, in response to column select signals (4), (5), and others.

Consequently, in the burst transfer memory of the present invention, after the word line WLa of the memory Ma has reached the high level, high-speed random access read operations of the memory Mb are performed in response to the column select signals (1), (2), and (3), and high-speed page access read operations of the memory Ma can subsequently be performed in response to the column select signals (4), (5), . . . .

Here, it is needless to say that the number of random accesses to the memory Mb (1), (2), (3), . . . in FIG. 2A) varies depending on the relationship between the rise speed for the word line WLa of the memory Ma, shown in FIG. 4B, and the random access speed of the memory Mb, shown in FIG. 4A.

Figure 4C:
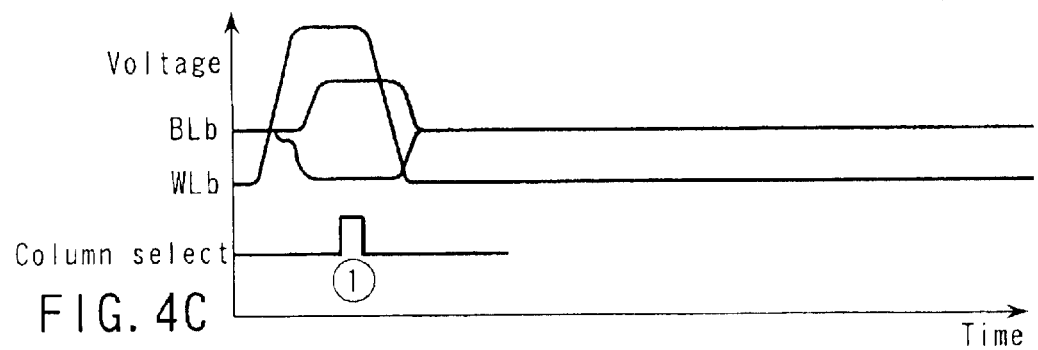
Figure 4D:
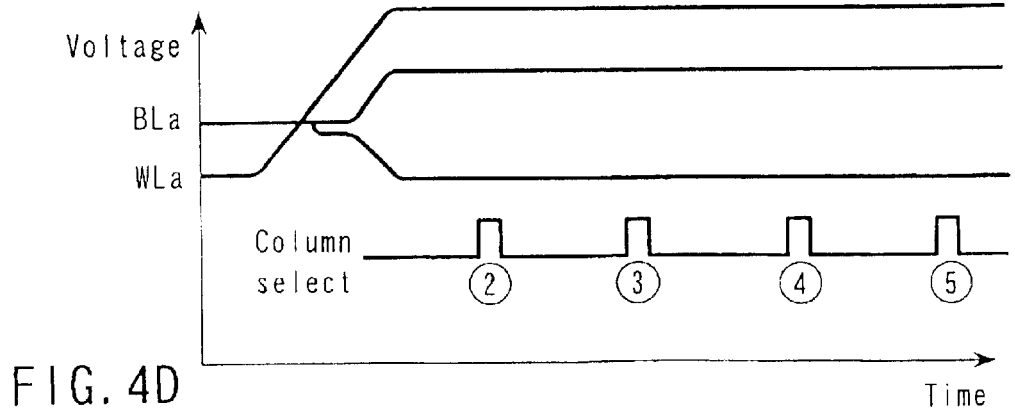

For example, if the rise speed for the word line WLa of the memory Ma is high as shown in FIG. 4D, a high-speed random access read operation of the memory Mb is performed in response to the column select signal (1) in FIG. 4C, and high-speed page access read operations of the memory Ma are subsequently performed in response to the column select signals (2), (3), (4), (5), . . . in FIG. 4D.

A conventional problem with fast page access operations of a large capacity memory is the amount of time required to activate the word line (rise time). However, a high-speed, large capacity burst transfer memory with a high area efficiency can be provided by thus combining a read operation of a small capacity, high-speed random access memory with a read operation of a large capacity, high-speed page access memory within the time required to activate the word line.

As shown in FIGS. 4A to 4D, a high-speed random access operation of the memory Mb and a high-speed page access operation of the memory Ma are substantially simultaneously started. Thus, memory data can be successively and continuously read from the I/O section via the DQ lines. A write operation and the like can be similarly performed, and description thereof is thus omitted.

That is, with the burst transfer memory of the present invention, while the top address of the high-speed random access memory Mb is being accessed, a row address of the high-speed page access memory Ma is completely activated. Subsequently, a high-speed access to the memory Ma is started. The burst transfer interface 3 (see FIG. 3) can manage and control allocation of addresses to the memories Ma and Mb and the order of accesses thereto.

Thus, an increase in chip area is suppressed. On the other hand, a high-speed burst transfer memory with a high area efficiency which can be used by a user as a single high-speed memory can be constructed by combining the large capacity memory Ma, which activates the word lines at a low speed, with the small capacity memory Mb, which activates the word lines at a high speed to enable random accesses at a high speed and allocating data from the cell arrays of the large capacity memory Ma and small capacity memory Mb to a continuous address space. Construction of the high-speed burst transfer memory of the present invention does not depend on the matrix configuration of the memory Mb (the number of rows and columns), division of the cell array, a difference in type between the memories Ma and Mb, or the like.

<Third Embodiment>

Now, a third embodiment will be described with reference to FIGS. 5 and 6A to 6D. In the third embodiment, description will be given of a pattern layout of the burst transfer memory of the present invention, notably the arrangement of DQ lines through which write or read data are input to or output from the large capacity page access memory Ma or the small capacity, high-speed random access memory Mb.

Figure 5:
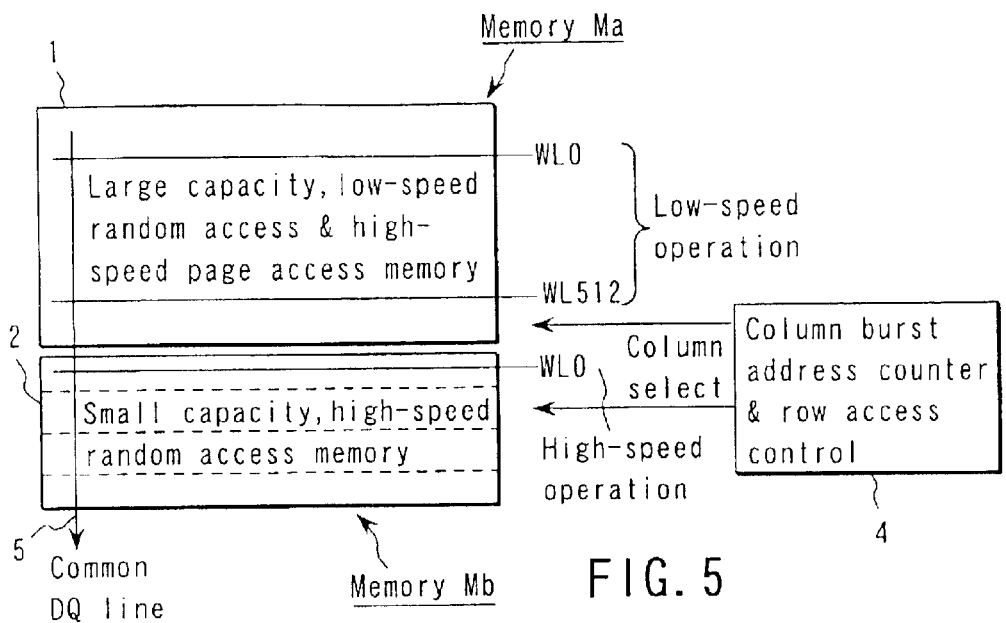
FIG. 5 is a block diagram showing the configuration of a burst transfer memory according to a third embodiment.

FIG. 5 is a diagram showing the configuration of a burst transfer memory according to the third embodiment. The burst transfer memory shown in FIG. 5 comprises the large capacity, low-speed random access memory 1 (high-speed page access memory Ma), the small capacity, high-speed random access memory 2 (high-speed random access memory Mb), a column burst address counter and row access control section 4, and common DQ lines 5.

The operation of burst transfer memory of this embodiment is similar to those of the burst transfer memories described in the first and second embodiments. That is, for a random access to the top address, the small capacity, high-speed memory Mb is accessed, and at substantially the same time, activation of a row address of the large capacity memory Ma is started. While the random access to the top address is being carried out in the memory Mb at a high speed, the row address of the large capacity memory Ma is completely activated. Subsequently, a high-speed page access to the memory Ma is started. The column burst address counter and row access control section 4 manages and controls allocation of addresses to the memories Ma and Mb and the order of accesses thereto.

In this case, the construction of burst transfer memory of this embodiment is characterized in that the widths of the memories Ma and Mb in their word line direction are set to be equal and in that the memories Ma and Mb are arranged adjacent to each other in their column direction so that corresponding columns are aligned with one another. Further, the common DQ lines 5 of the memories Ma and Mb are each arranged on a corresponding one of the columns of the memories Ma and Mb, arranged adjacent to each other so that corresponding columns are aligned with one another.

Further, in the burst transfer memory shown in FIG. 5, a space portion is provided between the cell array area of the memory Ma and the cell array area of the memory Mb. However, this space portion is not essential, but the memories may be a continuous cell array. Furthermore, the cell array area of the memory Mb may be divided along its column direction.

Now, a method of transferring memory data through the common DQ lines 5 will be described taking a read operation by way of example. The small capacity, high-speed memory only for random access use Mb is accessed. Memory data for the top address are read from the memory Mb and then output to an I/O section (not shown) via the corresponding plurality of common DQ lines. In parallel with this, activation of a row address (a word line) of the large capacity, high-speed page access memory Ma is started. After the word line has been completely activated, the high-speed page access to the memory Ma is started.

The memory data read from the memories Ma and Mb are loaded into the I/O section via the common DQ lines 5. A write operation is the inverse of the above operation, and description thereof is thus omitted.

If the common DQ lines 5 of the memories Ma and Mb are each arranged on the corresponding one of the columns of the memories Ma and Mb, arranged adjacent to each other in their column direction, as shown in FIG. 5, then the number of DQ lines can be reduced to half compared to the case in which the memories Ma and Mb are arranged adjacent to each other in their word line direction as shown in FIG. 3. This simplifies wiring steps, while reducing the chip size.

Then, a variation of the third embodiment will be described with reference to FIGS. 6A to 6D. In this variation, description will be given of arrangements of the common DQ lines 5 corresponding to various matrix shapes of the small capacity, high-speed random access memory Ma and large capacity, high-speed page access memory Mb.

Figure 6A:
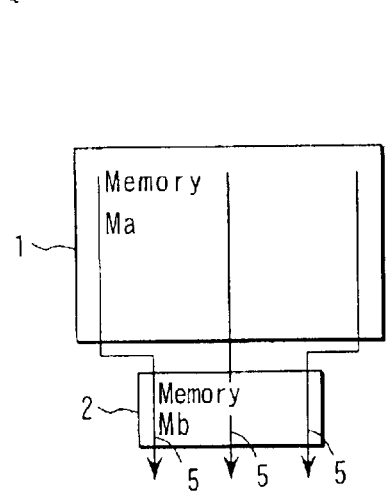
FIGS. 6A to 6D are block diagrams showing variations of the burst transfer memory according to the third embodiment.

In the burst transfer memory shown in FIG. 6A, the memory Mb is narrower than the memory Ma in their word line direction, but these memories have an equal number of columns. In this case, a space portion is provided between the memories Ma and Mb, and the corresponding DQ lines 5 are wired by bending them in crank form. In this case, the columns are prevented from being misaligned in the center of the memories. As a result, the DQ lines can be linearly arranged.

Figure 6B:
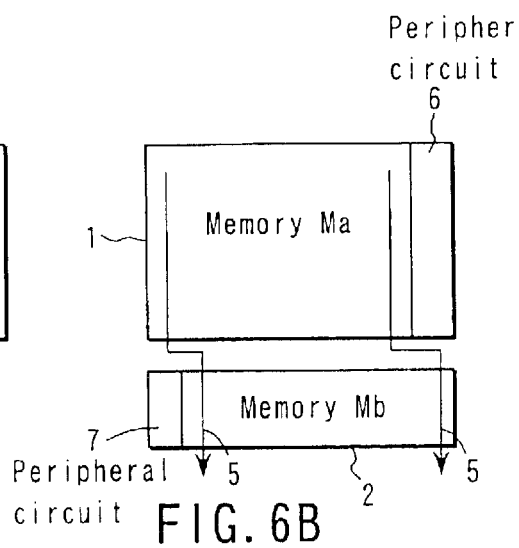

In the burst transfer memory shown in FIG. 6B, the memories Ma and Mb have an equal width in their word line direction. However, a peripheral circuit 6 of the memory Ma which is formed along one of those sides of the memory Ma which extend along the bit line direction of the cell array is arranged, in the word line direction, opposite a peripheral circuit 7 of the memory Mb which is formed along the other of those sides of the memory Ma which extend along the bit line direction of the cell array. In this case, a space portion is provided between the memories Ma and Mb, and the corresponding DQ lines 5 are wired by bending them in crank form.

Figure 6C:
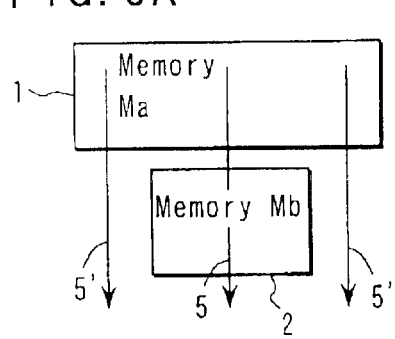
Figure 6D:
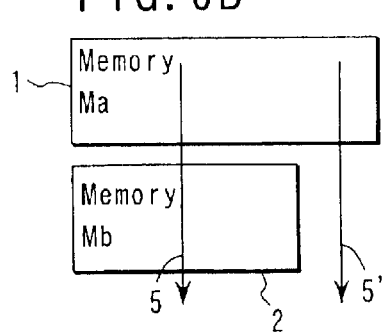

In the burst transfer memories shown in FIGS. 6C and 6D, the memory Mb is narrower than the memory Ma in their word line direction. Furthermore, the memories Ma and Mb have different numbers of columns. In this case, in addition to the common DQ lines 5, DQ lines 5' exclusively used for the memory Ma may be used.

<Fourth Embodiment>

Then, a burst transfer memory according to a fourth embodiment will be described with reference to FIG. 7. In the fourth embodiment, the small capacity, high-speed random access memory Ma and the large capacity, high speed page access memory Mb each comprise an I/O section. Memory data output by each I/o section are controlled by a burst memory control section.

Figure 7:
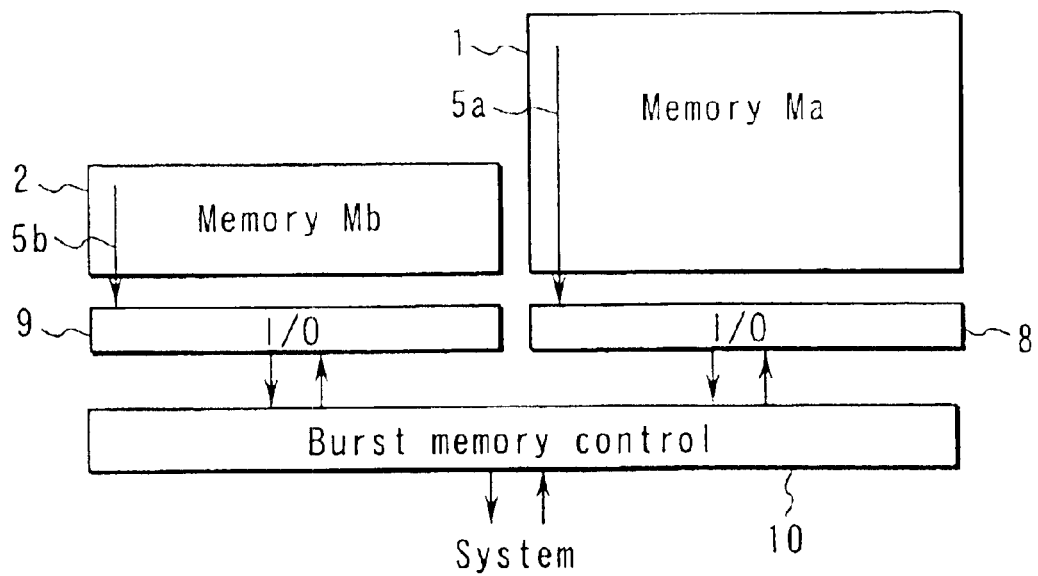
FIG. 7 is a block diagram showing the configuration of a burst transfer memory according to a fourth embodiment.

In the burst transfer memory shown in FIG. 7, the large capacity page access memory Ma comprising DQ lines 5a and an I/O section 8 is arranged, in the word line direction, opposite the small capacity, high speed random access memory Mb comprising DQ lines 5b and an I/O section 9. A burst memory control section 10 is used to control allocation of addresses to the memories Ma and Mb and the order of accesses.

In the burst transfer memory shown in FIG. 7, the memories Ma and Mb comprises the DQ lines 5a and 5b, respectively, through which memory data are transferred, and the I/O sections 8 and 9 for memory data, respectively. Consequently, the memories Ma and Mb may be different and highly independent of each other. These memories are combined together so as to constitute a high-speed burst transfer memory by using a processing function of the burst transfer memory control section 10, located outside the I/O sections 8 and 9.

In the burst transfer memory in FIG. 7, the memories Ma and Mb have an equal width in their word line direction. However, these memories need not necessarily have an equal width. In the burst transfer memory shown in FIG. 7, the memories Ma and Mb are highly independent of each other. Consequently, the burst transfer memory shown in FIG. 7 has a higher degree of freedom to combine the memories than the burst transfer memory according to the first embodiment, shown in FIG. 3.

<Fifth Embodiment>

Now, a burst transfer memory according to a fifth embodiment will be described with reference to FIG. 8. In the fifth embodiment, description will be given of a burst transfer memory having, for example, first sense amplifiers SA1 arranged in two sense amplifier forming regions of the large capacity, high-speed page access memory Ma and in one sense amplifier forming region of the small capacity, high-speed random access memory Mb, and a second sense amplifier SA2 for the entire burst transfer memory which is arranged in a sense amplifier forming region of a peripheral circuit 11 of the burst transfer memory.

Upon receiving outputs from the first sense amplifiers SA1, arranged in the two sense amplifier forming regions of the memory Ma and in the one sense amplifier forming region of the memory Mb, the second sense amplifier SA2, arranged in the sense amplifier forming region of the peripheral circuit 11, output memory data from the memories Ma and Mb through an I/O section arranged in the peripheral circuit 11.

Figure 8:
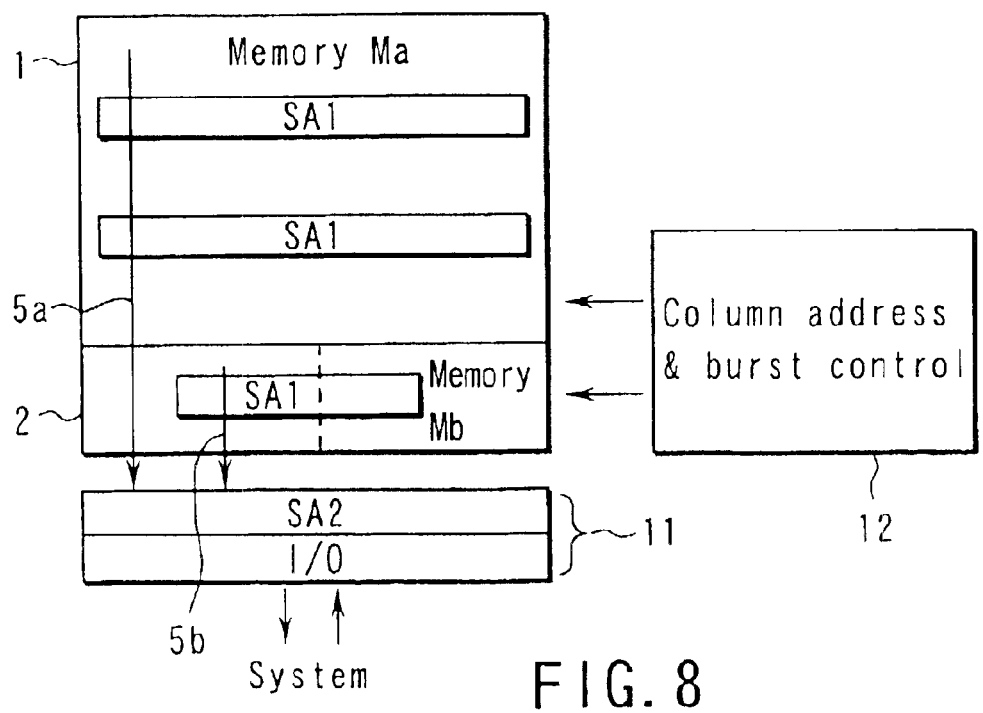
FIG. 8 is a block diagram showing the configuration of a burst transfer memory according to a fifth embodiment.

In the burst transfer memory shown in FIG. 8, the memory Ma, which comprises the DQ lines 5a and the two first sense amplifiers SA1, is arranged, in the column direction, adjacent to memory Mb, which comprises the DQ lines 5b and the one first sense amplifier SA1.

As shown in FIG. 8, memory data in a selected page of the memory Ma are input, via the first sense amplifiers SA1 of the memory Ma and the DQ line 5a, to the second sense amplifier SA2 for the entire burst memory, which is arranged in the peripheral circuit 11. For example, as shown in FIG. 8, the DQ line 5a in the memory Ma is connected to both first sense amplifiers SA1 of the memory Ma and to the sense amplifier SA2 as a common DQ line through which memory data retained in the two first sense amplifiers SA1 are read.

On the other hand, memory data from the memory Mb are input to the second sense amplifier SA2 for the entire burst memory, which is arranged in the peripheral circuit 11, and the DQ line 5b is then used as a DQ line through which memory data retained in the first sense amplifier SA1 of the memory Mb are read.

The memory data from the memories Ma and Mb, which have been transferred using the DQ lines 5a and 5b, are output to a system through the I/O section via the sense amplifier SA2 for the entire burst transfer memory, which is arranged in the peripheral circuit 11. A write to the burst transfer memory is a reverse operation compared to the operation described above, and description thereof is thus omitted. A column address and burst control section 12 controls allocation of addresses to the memories Ma and Mb and the order of accesses.

In this manner, the first sense amplifiers SA1 are provided inside the cell arrays of the memories Ma and Mb, and the second sense amplifier SA2 is provided in the peripheral circuit section for the entire burst transfer memory. Consequently, outputs of memory data from the memories Ma and Mb, which have different memory capacities and operating speeds, become uniform to allow the system to operate more reliably.

The present invention is not limited to the above embodiments. For example, in the first to fifth embodiments, a burst transfer memory with a variable word length can be provided by expanding the functions of the control circuit. Many other variations may be implemented without deviating from the spirits of the present invention.

As described above, according to the present invention, a high-speed and large capacity burst transfer memory can be provided which serves to minimize an increase in chip area.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A burst transfer memory comprising:
   a first memory having a cell array arranged in a matrix;
   a second memory which has a cell array arranged in a matrix and which performs a random access operation at a higher speed than the first memory;
   write and read data lines each connected to a corresponding column of the first and second memories: and
   an interface circuit which controls the first and second memories as one burst transfer memory,
   wherein the second memory cell array is arranged adjacent to the first memory cell array in a bit line direction of the first memory cell array, and wherein the interface circuit allocates addresses to the first and second memories as consecutive addresses, and the interface circuit substantially simultaneously starts a first random access to the first and second memories, accesses the second memory before a word line of the first memory is activated, and consecutively accesses a page of the first memory after the word line of the first memory has been activated, and
   wherein the number of columns in the first memory cell array in a word line direction thereof is equal to the number of columns in the second memory cell array in a word line direction thereof, and the first memory cell array is wider than the second memory cell array in the word line direction, and wherein a space portion is provided between the first and second memory cell arrays, and the same write and read data lines are connected to each column of the first and second memories, the write and read data lines including those bent in crank form at the position of the space portion.

2. A burst transfer memory according to claim 1, wherein the second memory cell array comprises a plurality of sub-arrays into which the memory cell array has been divided along the bit line direction.

3. A burst transfer memory according to claim 1, wherein before the word line of the first memory is activated, the number of accesses to the second memory varies depending on the speeds of accesses to the first and second memories.

4. A burst transfer memory according to claim 1, wherein the number of rows in the second memory cell array in the bit line direction thereof is smaller than the number of rows in the first memory cell array in the bit line direction thereof.

5. A burst transfer memory comprising:
   a first memory having a cell array arranged in a matrix;
   a second memory which has a cell array arranged in a matrix and which performs a random access operation at a higher speed than the first memory;
   write and read data lines each connected to a corresponding column of the first and second memories; and
   an interface circuit which controls the first and second memories as one burst transfer memory,
   wherein the second memory cell array is arranged adjacent to the first memory cell array in a bit line direction of the first memory cell array, and wherein the interface circuit allocates addresses to the first and second memories as consecutive addresses, and the interface circuit substantially simultaneously starts a first random access to the first and second memories, accesses the second memory before a word line of the first memory is activated, and consecutively accesses a page of the first memory after the word line of the first memory has been activated, and
   wherein the first memory cell array comprises a first peripheral circuit section formed along one of the sides of the memory cell array which are parallel with a bit line direction of the memory cell array, and the second memory cell array comprises a second peripheral circuit section formed along the other of the sides of the memory cell array which are parallel with the bit line direction, wherein the number of columns in the first memory cell array in the word line direction thereof is equal to the number of columns in the second memory cell array in the word line direction thereof, and a space portion is provided between the first and second memory cell arrays, and wherein the same write and read data lines are connected to each column of the first and second memories and are bent in crank form at the position of the space portion.

6. A burst transfer memory according to claim 5, wherein the second memory cell array comprises a plurality of sub-arrays into which the memory cell array has been divided along the bit line direction.

7. A burst transfer memory according to claim 5, wherein before the word line of the first memory is activated, the number of accesses to the second memory varies depending on the speeds of accesses to the first and second memories.

8. A burst transfer memory according to claim 5, wherein the number of rows in the second memory cell array in the bit line direction thereof is smaller than the number of rows in the first memory cell array in the bit line direction thereof.

9. A burst transfer memory comprising:
   a first memory having a cell array arranged in a matrix;
   a second memory which has a cell array arranged in a matrix and which performs a random access operation at a higher speed than the first memory;
   write and read data lines each connected to a corresponding column of the first and second memories; and
   an interface circuit which controls the first and second memories as one burst transfer memory,
   wherein the second memory cell array is arranged adjacent to the first memory cell array in a bit line direction of the first memory cell array, and wherein the interface circuit allocates addresses to the first and second memories as consecutive addresses, and the interface circuit substantially simultaneously starts a first random access to the first and second memories, accesses the second memory before a word line of the first memory is activated, and consecutively accesses a page of the first memory after the word line of the first memory has been activated, and
   wherein the number of columns in the first memory cell array in a word line direction thereof is larger than the number of columns in the second memory cell array in a word line direction thereof, and the first memory cell array is wider than the second memory cell array in the word line direction, and wherein the burst transfer memory further comprises write and read data lines connected exclusively to columns of the first memory, which columns are separate from said columns of the first and second memories.

10. A burst transfer memory according to claim 9, wherein the second memory cell array comprises a plurality of sub-arrays into which the memory cell array has been divided along the bit line direction.

11. A burst transfer memory according to claim 9, wherein before the word line of the first memory is activated, the number of accesses to the second memory varies depending on the speeds of accesses to the first and second memories.

12. A burst transfer memory according to claim 9, wherein the number of rows in the second memory cell array in the bit line direction thereof is smaller than the number of rows in the first memory cell array in the bit line direction thereof.

13. A burst transfer memory comprising:

a first memory having a cell array arranged in a matrix;

a second memory which has a cell array arranged in a matrix and which performs a random access operation at a higher speed than the first memory;

write and read data lines each connected to a corresponding column of the first and second memories; and an interface circuit which controls the first and second memories as one burst transfer memory, wherein the second memory cell array is arranged adjacent to the first memory cell array in a bit line direction of the first memory cell array, and wherein the interface circuit allocates addresses to the first and second memories as consecutive addresses, and the interface circuit substantially simultaneously starts a first random access to the first and second memories, accesses the second memory before a word line of the first memory is activated, and consecutively accesses a page of the first memory after the word line of the first memory has been activated, wherein the burst transfer memory comprises first sense amplifiers arranged in the first and second memory cell arrays, respectively, and a second sense amplifier arranged in a peripheral circuit section of the burst transfer memory, and wherein write and read data lines each arranged on a corresponding one of the columns of the first memory cell array connect together the first sense amplifiers arranged in the first memory cell array and the second sense amplifier, and write and read data lines each arranged on a corresponding one of the columns of the second memory cell array connect together the first sense amplifiers arranged in the second memory cell array and second sense amplifier.

14. A burst transfer memory according to claim 13, wherein the second memory cell array comprises a plurality of sub-arrays into which the memory cell array has been divided along the bit line direction.

15. A burst transfer memory according to claim 13, wherein before the word line of the first memory is activated, the number of accesses to the second memory varies depending on the speeds of accesses to the first and second memories.

16. A burst transfer memory according to claim 13, wherein the number of rows in the second memory cell array in the bit line direction thereof is smaller than the number of rows in the first memory cell array in the bit line direction thereof.

* * * * *